US006366308B1

(12) United States Patent
Hawryluk et al.

(10) Patent No.: US 6,366,308 B1
(45) Date of Patent: Apr. 2, 2002

(54) LASER THERMAL PROCESSING APPARATUS AND METHOD

(75) Inventors: Andrew M. Hawryluk, Los Altos Hills; Weijian Wang, San Jose; David G. Stites, Los Altos; Yu Chue Fong, Fremont, all of CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/505,605

(22) Filed: Feb. 16, 2000

(51) Int. Cl.[7] .............................. B41J 27/00; B41J 2/435
(52) U.S. Cl. ..................... 347/256; 347/241; 347/224
(58) Field of Search .............................. 347/238, 224, 347/241, 256, 262; 250/483.1; 355/61, 65, 68; 430/297, 302

(56) References Cited

U.S. PATENT DOCUMENTS

| 4,151,008 | A | | 4/1979 | Kirkpatrick | 438/799 |
|---|---|---|---|---|---|
| 4,154,625 | A | | 5/1979 | Golovchenko et al. | 438/45 |
| 4,316,074 | A | | 2/1982 | Daly | 219/121.6 |
| 4,847,850 | A | | 7/1989 | Kafka et al. | 502/249 |
| 5,059,013 | A | | 10/1991 | Jain | 359/503 |
| 5,357,077 | A | | 10/1994 | Tsuruta | 219/121.68 |
| 5,357,365 | A | | 10/1994 | Ipposhi et al. | 359/205 |
| 5,519,227 | A | * | 5/1996 | Karellas | 250/483.1 |
| 5,760,963 | A | | 6/1998 | Mori | 359/622 |
| 5,852,693 | A | | 12/1998 | Jeong | 385/47 |
| 6,002,467 | A | * | 12/1999 | Nishi et al. | 355/61 |
| 6,108,026 | A | * | 8/2000 | Corbett | 347/262 |
| 6,115,107 | A | * | 9/2000 | Nishi | 355/68 |

OTHER PUBLICATIONS

Kachurin, et al., "Annealing of Implanted layers by a Scanning Laser Beam", Sov. Phys. Semicond., vol. 13, No. 10, Oct. 1976, pp 1128–1129.
Lever, "Background Heating for Laser Annealing", IBM Tech. Disc. Bull., vol. 21, No. 10, Mar. 1979, p 4040.
Hovel, "Laser Annealing and Diffusion Definition Using Metal Layers", IBM Tech. Disc. Bull., vol. 21, No. 10, Mar. 1979, p 4285.

* cited by examiner

Primary Examiner—Hai Pham
(74) Attorney, Agent, or Firm—Allston L. Jones

(57) ABSTRACT

An method of and apparatus (10) for performing laser thermal processing (LTP) of a workpiece (74) having one or more workpiece fields (78). The apparatus includes a pulsed, solid state laser light source (14) having more than 1000 spatial modes (M) and capable of emitting one or more pulses of radiation with a temporal pulse length between 1 nanosecond and 1 microsecond, a workpiece stage (70) for supporting the workpiece, and an illumination optical system having an exposure field (64). The system is arranged between the laser light source and the workpiece stage so as to illuminate within the exposure field at least one of the one or more workpiece fields with the one or more pulses of radiation, with an irradiance uniformity of less than ±5%. The method and apparatus is particularly well-suited for LTP processing of workpieces which require a single pulse or only a few pulses of high-irradiance radiation. Other applications of the present invention include rapid thermal annealing of semiconductor devices in semiconductor device manufacturing and processing, recording information in storage media, and, in general, conditioning surfaces.

31 Claims, 2 Drawing Sheets

LASER THERMAL PROCESSING APPARATUS AND METHOD

FIELD OF THE INVENTION

The present invention relates to thermal processing, and in particular apparatus and methods for performing rapid thermal processing of a workpiece by uniformly irradiating the workpiece with short pulses of high-irradiance radiation.

BACKGROUND OF THE INVENTION

Rapid thermal processing (RTP) involves heating (and subsequently cooling) a substrate ("workpiece") in order to effectuate a change in the workpiece. There are several industrial applications where RTP of a workpiece is required, such as annealing metals, and forming alloys or electrically activating dopants in a semiconductor. There are several RTP techniques known in the art, ranging from slowly heating the workpiece in a furnace, to exposing the workpiece with flashes of radiation from a flash lamp.

Whether a particular RTP technique is suitable for a given application depends primarily on how the workpiece needs to be heated to perform the desired process. For example, to anneal certain semiconductor wafers in forming certain types of semiconductor device structures, heating the wafer with a hot plate or a radiation lamp up to a high temperature and then cooling the wafer by letting it sit on a cooling plate at room temperature is a viable RTP technique. However, this technique is not suitable for applications where only a small region of the wafer needs to be heated and cooled extremely quickly (e.g., microseconds), because the thermal mass of the wafer simply does not allow for such rapid heating and cooling. While a flash-lamp may be used for such rapid heating and cooling, flash-lamps generally do not have the irradiance and temporal pulse length necessary to deliver the amount of energy to the workpiece to effectuate a change in the workpiece for many semiconductor applications.

An RTP technique that could have great potential where sub-microsecond heating and cooling times are required involves using a pulsed laser, and is referred to here as "laser thermal processing," or "LTP." The vast majority of RTP techniques require some minimum level of thermal uniformity at the substrate plane. When using an optical source or a laser to heat the substrate, this thermal uniformity requirement translates into an illumination uniformity requirement. Unfortunately, this requirement has hampered the use of pulse lasers for LTP because the pulsed lasers contemplated to date lack the illumination uniformity and pulse-to-pulse stability necessary to effectively carry out RTP.

Generally, when laser radiation is directed onto a workpiece to be processed (e.g., a wafer), micro and macro irradiance non-uniformities arise. The macro-intensity non-uniformity issue has been addressed through a variety of now-common uniformizing techniques, such as light tunnels, homogenizer rods and "fly's-eye-arrays". However, micro-intensity non-uniformity caused by the coherent nature of laser light has prevented lasers from becoming common light sources for RTP tools. While excimer lasers have been successfully deployed in industry because they are more "incoherent" than most other lasers (such as gas discharge or solid state lasers), they are not suitable for all industrial applications, and in particular LTP, because they lack pulse-to-pulse stability. Other problems with excimer lasers include their large size ("footprint") and their high maintenance costs.

As mentioned above, LTP has great potential application in the semiconductor industry. The fabrication of integrated electronic circuits involves ion implantation to introduce dopants (N or P type) into a semiconductor (e.g., silicon, germanium, gallium arsenide, or the like) substrate to change its conductivity. Generally this procedure is used in implanting source or drains of a MOSFET transistor or base, emitter, collectors of BIPOLAR transistors, the cathode of diodes, a resistive region element, or even as a capacitor plate. In short, there are many reasons why it is desirable to change the conductivity of a semiconductor substrate. The implantation of the dopant atoms breaks the chemical bonds of the crystalline substrate where they are implanted, and in some cases can render a region amorphous, that is, break the crystalline lattice of the region.

To obtain good electrical performance of the electronic components defined by the implantation, the implanted regions must be annealed. The annealing process takes the regions that were previously made amorphous and recreates a more crystalline structure. Also, the dopants need to be "activated" by incorporating these atoms into the crystalline lattice of the semiconductor substrate. This requires providing a relatively large amount of thermal energy to the region in a short of amount of time, and then rapidly cooling the region to terminate the thermal process.

A successful, robust LTP apparatus preferably satisfies ten design requirements. The first is that the apparatus be fully automated and include remote wafer handling, so that many substrates ("workpieces") can be processed without the need for human intervention. The second is that the apparatus expose full die-by-die fields, i.e., no exposure of a partial field. The third is that the apparatus provide sufficient irradiance per pulse to accomplish the goals of LTP, such as dopant activation or thermal annealing, which require irradiance levels of between 0.1 $J/cm^2$ to 1.0 $J/cm^2$ per pulse. The fourth is that illumination uniformity (both macro- and micro-uniformity) over the exposure field be within ±5%, so that the corresponding thermal uniformity is equally uniform. The fifth requirement is that the pulse-to-pulse energy stability (repeatability) of the laser be within ±5% (and preferably vary only by nanoseconds for sub-microsecond pulses) so that the results from field to field are repeatable. The sixth is that each die (i.e., workpiece field) on the workpiece be aligned to the exposure field to an accuracy within ±50 microns (within the non-active KERF design region) so that proper exposure is contained within each field. The seventh is that the illumination fall-off at the edge of the exposure field be very sharp, i.e., a resolution of less than 50 microns, so that there is no exposure of adjacent fields on the workpiece. The eighth is that the field size should be definable from 1 mm×1 mm up to 22 mm×22 mm to allow for the variety of field sizes for which the LTP apparatus could be used. The ninth is that the apparatus be programmable to deliver energy from 0.1 $J/cm^2$ to 1 $J/cm^2$. The tenth is that the apparatus have diagnostic ability to monitor certain key parameters associated with the LTP process, such as whether the workpiece has melted, the amount of transmitted energy, the amount of reflected energy from the workpiece, and the beam profile.

There are many prior art illumination apparatus that provide uniform illumination, but that do not meet the above-identified requirements. For example, U.S. Pat. No. 5,059,013, entitled "Illumination System to Produce Self-luminous Light Beam of Selected Cross-section, Uniform Intensity and Selected Numerical Aperture," discloses an illumination system which produces a light beam of selected cross-section shape and uniform intensity, which emits self-luminously into a selected numerical aperture, by: providing a non-uniform, non-self-luminous laser light beam; configuring the beam to eliminate the non-uniformity's near the beam periphery; providing the semi-uniform light beam to a light gate; providing also a lamp light beam with optics and infra-red trap; gating selectively the laser light beam or the lamp light beam to a light beam characterization subsystem; configuring the selected semi-shaped semi-uniform non-self-luminous light beam to provide a selected shaped semi-uniform non-self-luminous light beam; focusing the selected shaped semi-uniform non-self-luminous light beam, with a focal length related to the selected numerical aperture, onto the input plane of a total-internally-reflective beam-shaper-uniformizer, causing multiple reflections within the uniformizer and overlapping of different parts of the beam with one another, the length of the beam-shaper-uniformizer being related to the selected intensity uniformity, resulting in a selected shaped uniform semi-self-luminous light beam at the exit plane; diffusing the light beam; passing the selected shaped uniform self-luminous light beam through a collection lens to convey the beam with the selected numerical aperture toward an application subsystem. Unfortunately, this illumination system is fairly complex and it does not deal with the issue of micro-non-uniformities resulting from laser-coherence effects within the totally-internally-reflecting homogenizer rod. This violates the forth requirement which states a macro- and micro-uniformity requirement of <±5%.

U.S. Pat. No. 5,357,365, entitled "Laser Beam Irradiating Apparatus Enabling Uniform Laser Annealing," describes a laser beam irradiating apparatus capable of laser annealing with high precision and uniformity over the entire surface of a sample. Luminous flux of the laser beam output from a laser source is expanded by a beam expander. The power of the laser beam, which has passed through the beam expander, is adjusted by a half-wave plate of synthetic quartz and a polarizing prism of synthetic quartz. The laser beam emitted from polarizing prism is guided to a prescribed position by mirrors, and swung in the direction of the X-axis by an X-axis rotation mirror. The laser beam reflected from X-axis rotation mirror has its diameter reduced by an f-θ lens to have a prescribed beam spot diameter on the surface of a silicon wafer, and laser beam scanning is carried out at a constant speed. Since half-wave plates and the polarizing prisms are formed of synthetic quartz, thermal deformation of optical components caused by continuous irradiation of a laser beam can be suppressed, beam profile of the laser beam can be stabilized, therefore highly uniform and highly precise laser annealing becomes possible. Unfortunately, this illumination system is fairly complex and is reduced in size at the workpiece. That is, only a small area is exposed and is scanned across the workpiece. This approach is inconsistent with the second requirement of providing a full field exposure.

SUMMARY OF THE INVENTION

The present invention relates to thermal processing, and in particular apparatus and methods for performing rapid thermal processing of a workpiece by uniformly irradiating the workpiece with short pulses of high-irradiance radiation.

A first aspect of the present invention is an LTP apparatus for processing a workpiece having one or more workpiece fields. The apparatus comprises a pulsed, solid state laser light source having more than 1000 spatial modes and capable of emitting one or more pulses of radiation with a temporal pulse length between 1 nanosecond and 1 microsecond, a workpiece stage for supporting the workpiece, and an illumination optical system having an exposure field, the system being arranged between the laser light source and the workpiece holder so as to illuminate within the exposure field at least one of the one or more workpiece fields with the one or more pulses of radiation having an irradiance uniformity of less than ±5%.

A second aspect of the present invention described above is the apparatus, wherein the illumination optical system includes, in order along an optical axis from the laser light source, a beam transport system, a diffuser, an optical integrator, a variable aperture stop for defining the size of the exposure field, and an imaging optical system for forming the exposure field.

A third aspect of the present invention is a method of performing laser thermal processing of a workpiece over an exposure field. The method comprises the steps of first, aligning the workpiece to the exposure field, then providing one or more substantially incoherent radiation pulses having an irradiance from a laser light source having greater than 1000 spatial modes and capable of emitting radiation pulses having a temporal pulse length of between 1 nanosecond and 1 microsecond with a pulse to pulse repeatability of less than ±5%, uniformizing the radiation pulse such that the radiation pulse vary in uniformity by less than ±5% over the exposure field, and exposing the workpiece with the one or more radiation pulses over the exposure field.

BRIEF DESCRIPTION OF THE DRAWINGS

FIG. 2 is a schematic optical diagram, side view, of a light tunnel optical integrator, showing three light rays traveling through a light tunnel, with two of the rays undergoing a single reflection ("bounce"), and one ray traveling straight through.

DETAILED DESCRIPTION OF THE INVENTION

The present invention relates to thermal processing, and in particular apparatus and methods for performing rapid thermal processing of a workpiece by uniformly irradiating the workpiece with short pulses of high-irradiance radiation.

Figure 1:
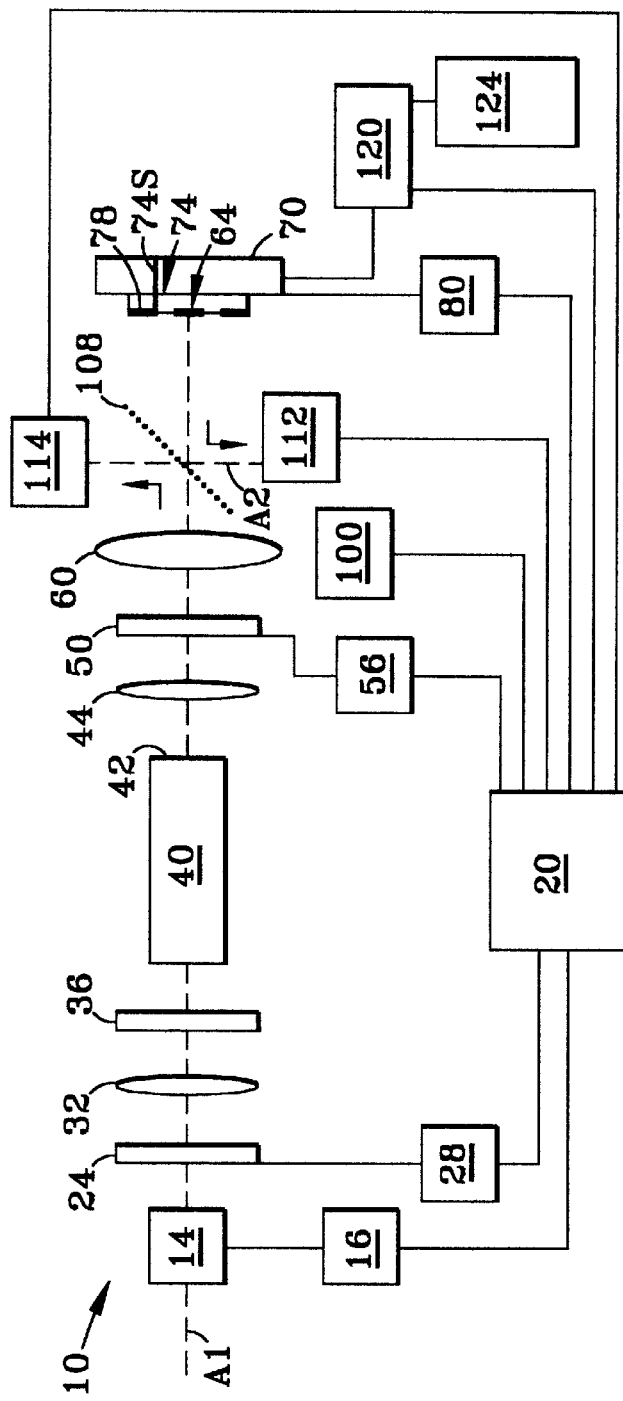
FIG. 1 is a schematic diagram of the LPT apparatus of the present invention.

With reference to FIG. 1, LTP apparatus 10 of the present invention comprises, along an axis A1, a laser light source 14. Laser light source 14 is preferably a highly multi-mode, solid state laser capable of generating pulsed laser light (radiation). Laser light source 14 preferably has greater than 1000 spatial modes, and even more preferably has greater than 10,000 spatial modes, so that it is essentially spatially incoherent. This is because, even with an optical system having a beam uniformizing optics, speckle or interference fringes can produce a micro-uniformity variation in irradiance with a modulation up to 100%. This occurs when parts of the original laser beam within the beam uniformizing optics are coherent with other parts of the laser and produce speckle, resulting in micro-uniformity variations or modulations. It has been found by the present inventors that the micro-uniformity variations (or modulations) resulting from such coherence effects can be reduced by increasing the number of spatial modes in laser light source 14. The % modulation of the irradiance non-uniformity due to interference effects can be represented approximately as a function of the number of spatial laser modes, M, by the relationship:

$$\% \text{ Modulation } (\pm 1\sigma) = \pm M^{-\frac{1}{2}}$$

For the purposes of the present invention, the number of modes that produce a given level of modulation due to coherence effects is given by the above equation. For example, for a ±3σ uniformity requirement of ±3% modulation, it is required that ±1σ=±1%. To achieve this value, M=10,000 modes.

Laser light source 14 further preferably has a temporal pulse length longer than about 1 nanosecond but shorter than about 1 microsecond, an energy output of between 100 mJ/cm$^2$ and 1000 mJ/cm$^2$ per pulse, an operating wavelength range from about 0.3 to 1.5 microns, a beam uniformity of better than σ5%, and a pulse-to-pulse stability of less than ±5%.

A light source 14 that satisfies the above requirements is very difficult to find, as most commercial applications, which call for highly coherent lasers, have only one or few (<10) modes. A class of lasers known as excimer lasers has a sufficient number of modes; however, this class of lasers is typically not very stable and violates the pulse-to-pulse stability requirement of this application. Solid-state laser light sources exhibit sufficient stability. Unfortunately, use of a highly coherent solid state laser light source 14 in the present invention would lead to a significant amount of micro-non-uniformities, and is thus not suitable. Nevertheless, the present inventors recognized that a multimode solid state laser would eliminate the micro-non-uniformities that are present in currently available solid state lasers. Although such lasers are actually the first type developed, they are not currently commercially available because historically they have had little, if any, practical use. Nevertheless, the inventors were able to have built by Continuum, Inc., Santa Clara, Calif., a multimode, doubled Nd:YAG laser with a 16 nanosecond (FWHM) pulse length and with an M$^2$ approximately greater than 150, thereby meeting the above-stated preferred requirements for a suitable laser light source 14. Exemplary lasers that can serve as laser light source 14, when modified to operate with a large number of spatial modes include a Nd:YAG laser, a Nd:glass laser, an Alexandrite laser, and a Ti:Saphire laser. These lasers can be operated at their natural lasing frequency, or can be frequency multiplied (i.e., frequency doubled, tripled or quadrupled).

Laser light source 14 is electrically connected to a light source control unit 16, which in turn is electronically connected to a computer 20 for controlling the light source control unit and the other control units and detectors, described below, via electronic signals, also as described in greater detail below. An exemplary computer 20 is a personal computer, such as is available from any one of a number of well-know computer companies, such as Dell Computer, Austin, Tex. Computer 20 preferable includes any of a number of commercially available microprocessors, such as the Intel PENTIUM™ series, or a AMD K6™ or K7™ processor, a suitable bus architecture to connect the processor to a memory device, such as a hard disk drive, and suitable input and output devices.

With continuing reference to FIG. 1, apparatus 10 further includes, adjacent laser light source 14 and along axis A1, a variable attenuator element 24 for attenuating the pulsed laser light emanating from the laser light source. Variable attenuator element 24 is operatively connected to an attenuator control unit 28, which controls the amount of attenuation of the pulsed laser light. Attenuator control unit 28 is also electronically connected to computer 20, which controls the attenuator control unit via an electronic signal. Variable attenuator element 24 may be, for example, a neutral density graded attenuator wheel, and attenuator control unit 28 may be a motor controller capable of rotating the attenuator wheel to achieve a desired attenuation.

Figure 2:
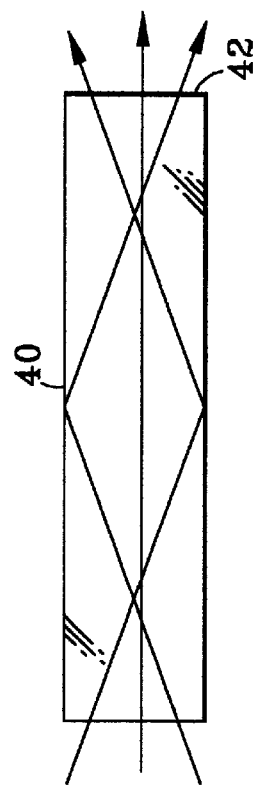

Apparatus 10 further includes, in order along axis A1 and adjacent variable attenuator element 24, a beam transport system 32, a diffuser 36, and an optical integrator 40 having an output end 42. Diffuser 36 may be ground glass or other type of element that disperses light incident thereon. Optical integrator 40 may be a fly's eye lens comprising a plurality of lenslets that break up the laser light incident thereon into a plurality of segments that are recombined in a manner that improves uniformity. With reference to FIG. 2, optical integrator 40 may also be a light tunnel i.e., a solid glass rod having a polygonal cross section and walls that reflect light traveling therethrough via total internal reflection, or a hollow rod having a polygonal cross section and reflective walls designed to reflect light traveling therethrough. A preferable design for optical integrator 40 is a solid quartz light tunnel having a square cross-section and a length capable of supporting between 4 and 10 total reflections in each plane of the input light (two beams, each with one total reflection, is shown in the plane view of FIG. 2). This range of the number of reflections ("bounces") is generally needed to take a beam with a gaussian profile and uniformize it to within about ±5%. An exemplary light tunnel for supporting an exposure field of variable size between 1 mm and 22 mm has a length of 500 mm, and a 5.7 mm×5.7 mm cross-section, made from fused quartz or other optical glasses, and as available from Bond Optics, Lebanon, N.H.

With continuing reference to FIG. 1, apparatus 10 further includes, adjacent optical integrator 40 along axis A1, a beam transfer optical system 44, and a variable aperture stop 50. Beam transfer system 44 has an F/# designed to capture light emanating from optical integrator 40. Because of the high irradiance of the laser beam, variable aperture stop 50 needs to be thermally resistant and ablation resistant. In a preferred embodiment, variable aperture stop 50 comprises four independently movable blades (not shown), made of stainless steel, highly reflective aluminum or tungsten, and arranged to form a rectangular or square aperture. Variable aperture stop 50 is operatively connected to an aperture stop control unit 56, which controls the size of variable aperture stop 50, e.g., by controlling the independently movable blades. Aperture stop control unit 56, in turn, is electronically connected to computer 20, which controls the aperture stop control unit via an electronic signal.

Apparatus 10 further includes an imaging optical system 60 arranged adjacent variable aperture stop 50, and a workpiece stage 70 serving as a workpiece holder and capable of supporting a workpiece 74 to be processed. Imaging optical system 60 is arranged such that it forms an image of variable aperture stop 50 over a uniform exposure field 64 onto workpiece 74. Exposure field 64 preferably has very sharp edges, i.e., a drop off of preferably about 50 μm or less. Accordingly, the resolution of imaging optical system 60 should be on the order of the edge sharpness required, e.g., on the order of 50 μm or less. For a diffraction limited system, this resolution can be expressed as the radius, R, of the Airy disc, given by R=1.22 λ/NA, where λ is the wavelength of the radiation, and NA is the work-piece-side numerical aperture of imaging optical system 60. For a resolution R of 50 μm, and a wavelength λ=542 nm, the NA=0.01. For many applications, imaging optical system 60 need not be diffraction-limited and may be limited by geometrical aberrations such as spherical aberration or coma. However, it is important that the field distortion be held to about 0.2% or less to maintain illumination uniformity.

Continuing with FIG. 1, workpiece 74 has a surface 74S and typically includes one or more workpiece fields 78 arranged over this surface. Workpiece 74 may be, or example, a silicon semiconductor substrate having a plurality of integrated circuit devices arranged over workpiece fields 78 and that require thermal annealing. Workpiece stage 70 is electronically connected to a workpiece stage controller 80 for controlling the position of the workpiece stage so as to position workpiece 70 to be exposed over the one or more workpiece fields 78. Workpiece stage controller 80, in turn, is electronically connected to computer 20, which controls the workpiece stage via an electronic signal and electronic signal applied to controller 80.

Beam transport system 32, diffuser 36, optical integrator 40, variable aperture stop 50, and imaging optical system 60 form the essential elements of an illumination optical system within apparatus 10.

Apparatus 10 further preferably includes an alignment system 100 adjacent workpiece stage 70 for aligning exposure field 64 with the particular workpiece field 78 to be processed. Alignment system 100 measures the alignment state of workpiece 74, provides an electrical signal containing that information to computer 20, which in turn applies an electrical signal to controller 80 to reposition stage 70 if necessary. Also preferably included in apparatus 10 is a beam-splitter 108 arranged along optical axis A1 between imaging optical system 60 and workpiece stage 70, and monitoring detectors 112 and 114 arranged along an axis A2 passing through the beam splitter perpendicular to axis A1, so that a portion of the light propagating towards workpiece 74 is deflected toward detector 114 by the beam-splitter, and a portion of any light reflected from the workpiece is deflected toward detector 112 by the beam-splitter. Detectors 112 and 114 are electronically connected to computer 20. Also, beam splitter 108 and detectors 112 and 114 can be arranged anywhere along axis A1 between output end 42 of optical integrator 40 and workpiece stage 70.

Apparatus 10 also preferable includes a workpiece handling system 120 electronically connected to computer 20 and in operable communication with workpiece stage 70. Workpiece handling system 120 is capable of delivering one or more workpieces 74 to or from a workpiece storage unit 124, and delivering one or more workpieces to or from workpiece stage 70 so that workpieces can be removed from the workpiece stage and stored in the workpiece storage unit, or removed from the workpiece storage unit and placed on the workpiece stage.

Description of the LTP Method

Figure 3:
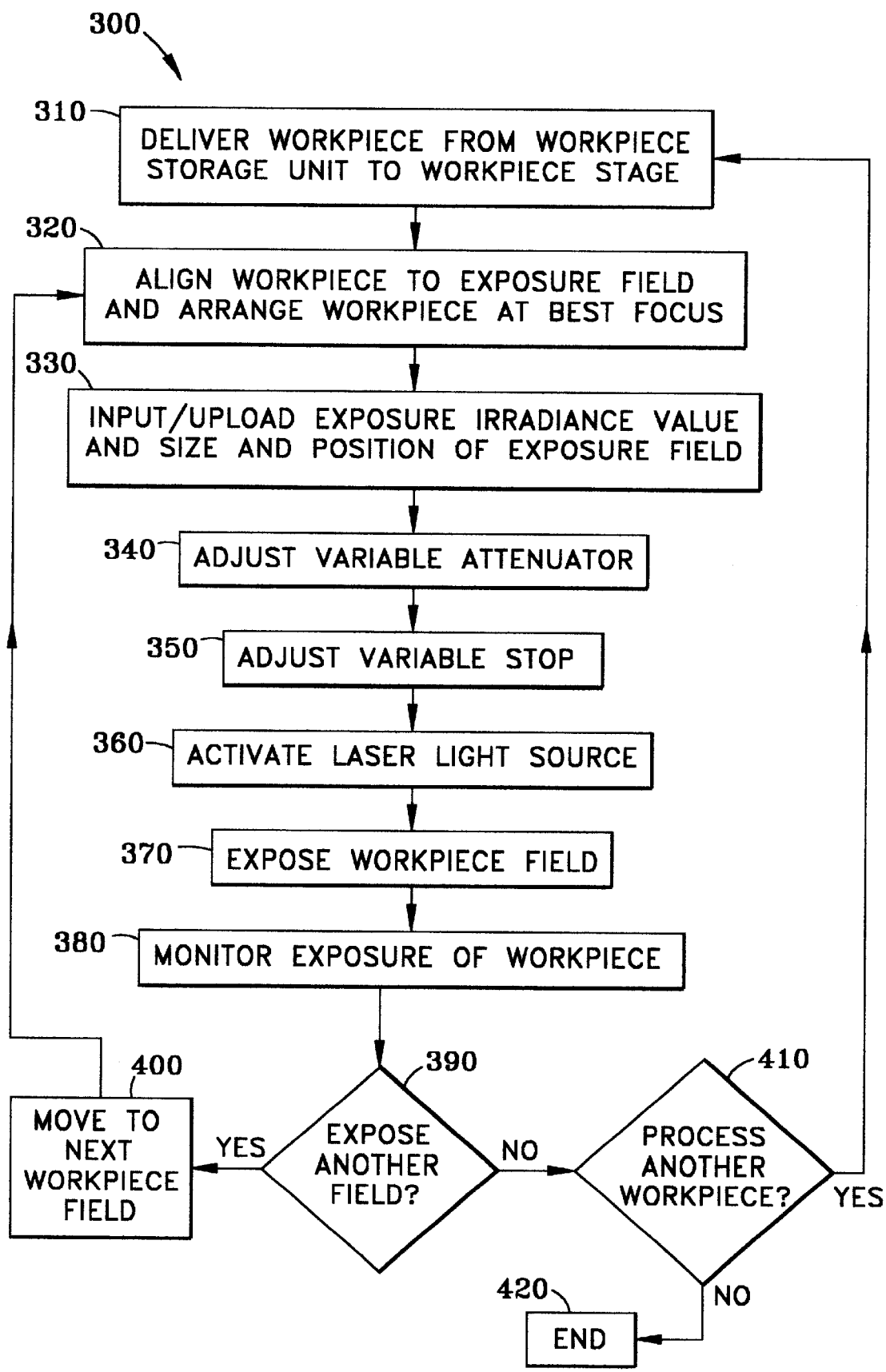
FIG. 3 is a flow diagram of the method steps associated with the method of performing LTP with the apparatus of FIG. 1.

With continuing reference to FIG. 1 and the flow chart 300 of FIG. 3 and steps 310–420, the operation of apparatus 10 and the method associated therewith is now described.

First, in step 310, if there is no workpiece 74 present on workpiece stage 70, computer 20 sends an electronic signal to workpiece handling system 120 to initiate the delivery of a workpiece from workpiece storage unit 124 to the workpiece stage 70.

Once workpiece 74 is placed on workpiece stage 70, then in step 320 computer 20 then sends an electronic signal to alignment system 100 to initiate alignment of the one or more workpiece fields 78 on workpiece 74 with exposure field 64. Alignment system 100 measures the alignment state of workpiece 74 and sends an electronic signal containing alignment information to computer 20. Computer 20 in turn sends an electronic signal to controller 80 to reposition workpiece stage 70 to position the workpiece so as to be properly aligned with respect to exposure field 64, and at the best focus of imaging optical system 60. This alignment process may require several iterations to achieve the optimal alignment and focus position of workpiece 74.

Once workpiece 74 properly positioned, then in step 330 the amount of irradiance required to process the workpiece is input into computer 20. In addition, the size and position of exposure field 64 is also recorded in the computer. These values may also be pre-stored in computer 20 in memory, and recalled in this step.

In either case, based on the irradiance value of step 3, in step 340 computer 20 sends an electronic signal to attenuator control unit 28, which then adjusts variable attenuator element 24 to provide an attenuation to achieve the desired amount of irradiance at workpiece 74. Preferably, at the same time, in step 350 computer 20 sends an electronic signal to aperture stop control unit 56 to adjust the size of exposure field 64 by varying stop 50.

Once variable attenuator element 24 and variable stop 50 are properly set, in step 360 computer 20 sends an electronic signal to light source control unit 16, which then activates laser light source 14 via an electronic signal, whereupon the laser light source provides one or more pulses of laser radiation (i.e., a pulsed laser beam of radiation) having a predetermined irradiance directed along axis A1. For many semiconductor applications, this irradiance is preferably in the range of 0.1 J/cm$^2$ to 1 J/cm$^2$. The laser radiation passes through variable attenuator element 24 and is attenuated by an amount set previously, and then passes through beam transport system 32.

Beam transport system 32 forms the one or more pulses of radiation into a desired configuration and relays the beam to diffuser 36. For example, beam transport system 32 may be a beam expander that takes a narrow beam of laser radiation and expands it to irradiate the entire front surface of diffuser 36. The radiation, upon passing through diffuser 36, is diffused over a range of angles. This diffuse radiation then enters optical integrator 40. Where optical integrator 40 is a light tunnel, the light undergoes reflections from the light tunnel walls and is recombined at the output end 42, where the irradiance distribution is uniform (or nearly so).

Beam transfer optical system 44 than transfers (i.e., relays) the light from output end 42 of optical integrator 40 to variable aperture stop 50. The latter has its aperture set by computer 20, via an electronic signal applied to aperture control unit 56, to a size corresponding to the size of workpiece fields 78 on workpiece 74. For an imaging optical system magnification $\beta$, a variable aperture 50 having a square aperture of height h, and a square field size 78 of height h', the variable aperture height h is preferable set to h'$\beta$. A typical magnitude of the value of $\beta$ is between 1 and 10.

With continuing reference to FIG. 1, and flow diagram 300 of FIG. 3, in step 370, imaging optical system 60 images radiation passing through variable aperture stop 50 onto workpiece 74 over exposure field 64 and exposes the workpiece field 78 previously aligned with the exposure field. The uniformity of the radiation over exposure field 64 is preferably within ±5% so that the workpiece field 78 being irradiated is uniformly heated. It is also preferable that any nonuniformities in the irradiation over exposure field 64 be on the order of, or smaller than, the thermal diffusion length of the material comprising workpiece 74. The thermal diffusion length is defined as the square root of T·k/($\rho$·C) where T is the length of time (sec) under consideration, k is the thermal conductivity (J/sec·cm·° C.), $\rho$ is the density (gm/cm$^3$), and C is the heat capacity (J/gm·° C.). For example, for a workpiece comprised of silicon, a typical thermal diffusion length is 1–10 microns for 10 nanosecond to 1 microsecond.

To ensure that workpiece 74 is being properly processed, it is preferable to monitor the radiation incident workpiece 74 and reflected from the workpiece. Accordingly, in step 380, a portion of the radiation exiting imaging optical system 60 is diverted by beam splitter 108 to detector 114 which sends a first detector electronic signal corresponding to the amount of radiation incident thereon to computer 20. In addition, a portion of the radiation reflected from workpiece 74 is diverted by beam splitter 108 to detector 112, which sends a second detector electronic signal corresponding to the amount of radiation incident thereon to computer 20. The first detector signal contains information about the radiation throughput of apparatus 10 from light source 14 through imaging optical system 60. The second detector signal contains information about surface 74S of workpiece 74. For example, if surface 74S becomes molten due to exposure with high-irradiance irradiation, the reflectivity of the surface will increase, and will thus reflect more light back towards the light source, a portion of which will be detected by detector 112. Thus, a jump in the amount of light detected at detector 112 can be related to a change in state of surface 74S of workpiece 74. By monitoring the first and second detector electronic signals, computer 20 can provide control signals to light source controller 16 to control the light source, attenuator control unit 28 to control variable attenuator element 24, and/or to workpiece stage control unit 80 to control workpiece stage 70, e.g., to position a different workpiece 78 in exposure field 64.

After the first workpiece field 78 has been exposed, then in step 390, a decision is made whether to expose another workpiece field. If the decision is "yes," then in step 400, workpiece stage 70 is instructed by computer 20 via an electrical signal sent to workpiece stage controller 80 to move stage 70, and thus workpiece 74 so that another workpiece field 78 is moved into exposure field 64. Then, steps 320 through 380 are repeated for the second workpiece field, and subsequent workpiece fields.

If the decision in step 390 is "no," then the method proceeds to step 410 which asks whether another workpiece is to be processed. If the answer is "yes," then the method returns to step 310 and steps 310 through 390 are repeated. If the answer is "no", then the method terminates at step 420, "end."

While the present invention has been described in connection with preferred embodiments, it will be understood that it is not so limited. In addition, while the present invention is particularly applicable to LTP processing for semiconductor applications, the present invention is useful for other applications, which by way of example, include rapid thermal annealing of semiconductor devices in semiconductor device manufacturing and processing, recording information in storage media and preconditions recording media surfaces and other such surfaces. Accordingly, the present invention is intended to cover all alternatives, modifications and equivalents as may be included within the spirit and scope of the invention as defined in the appended claims.

What is claimed is:

1. An apparatus for performing laser thermal processing of a workpiece having one or more workpiece fields, comprising:
   a pulsed, solid state laser light source having more than 1000 spatial modes and capable of emitting one or more pulses of radiation with a temporal pulse length between 1 nanosecond and 1 microsecond;
   a workpiece stage for supporting the workpiece; and
   an illumination optical system having an exposure field, said system arranged between said laser light source and said workpiece stage so as to illuminate within said exposure field at least one of the one or more workpiece fields with said one or more pulses of radiation having an irradiance uniformity of less than ±5%.

2. An apparatus according to claim 1, wherein said illumination optical system includes, in order along an optical axis from said laser light source:
   a beam transport system;
   a diffuser;
   an optical integrator;
   a variable aperture stop for defining the size of said exposure field; and
   an imaging optical system for forming said exposure field.

3. An apparatus according to claim 2, further including a variable attenuator element arranged between said laser light source and said diffuser, for attenuating said radiation.

4. An apparatus according to claim 3, further including a variable attenuator control unit operatively connected to said variable attenuator element for controlling the amount of attenuation provided by said variable attenuator.

5. An apparatus according to claim 2, further including a beam transfer optical system arranged between said optical integrator and said variable aperture stop.

6. An apparatus according to claim 5, further including a variable aperture stop control unit operatively connected to said variable aperture stop, for controlling the size of said variable aperture stop.

7. An apparatus according to claim 2, wherein said optical integrator is a light tunnel designed such that some of said radiation passing therethrough undergoes at least four reflections.

8. An apparatus according to claim 1, wherein said laser light source has a pulse to pulse stability of less than ±5%.

9. An apparatus according to claim 1, further including a workpiece stage control unit for controlling and positioning said workpiece stage relative to said illumination optical system.

10. An apparatus according to claim 1, wherein said laser light source is one selected from the group of the laser light sources consisting of: a Nd:YAG laser, a Nd:glass laser, an Alexandrite laser, and a Ti:Saphire laser.

11. An apparatus according to claim 1, further including:
   a computer electronically connected to said workpiece stage; and
   an alignment system electronically connected to said computer, for measuring an alignment state between the exposure field and the workpiece and providing an electronic signal corresponding to said alignment state to said computer.

12. An apparatus according to claim 1 further comprising:
   a workpiece handling system for transferring workpieces to and from said workpiece stage.

13. An apparatus according to claim 12, further including a workpiece storage unit for storing workpieces to be delivered to and from said workpiece stage via said workpiece handling system.

14. An apparatus for performing laser thermal processing of a workpiece having one or more workpiece fields, comprising in order along a first axis:
   a pulsed, solid state laser light source having more than 1000 spatial modes and capable of emitting pulsed radiation with a temporal pulse length between 1 nanosecond and 1 microsecond;
   a beam transport optical system;
   a diffuser;

an optical integrator arranged to receive light from said diffuser;

a variable aperture stop;

an imaging optical system having an exposure field with an irradiance uniformity of less than ±5%; and a workpiece stage for supporting the workpiece such that one of the one or more workpiece fields falls within said exposure field.

15. An apparatus according to claim 14, further including:

a variable attenuator element arranged between said light source and said optical integrator, said variable attenuator element operatively connected to an attenuator control unit capable of controlling said variable attenuator element via a first electronic signal;

a variable aperture stop control unit operatively connected to said variable aperture stop for controlling the size of said variable aperture stop via a second electronic signal;

a workpiece stage control unit electronically connected to said workpiece stage for controlling and positioning said workpiece stage relative to said exposure field via a third electronic signal; and a computer electronically connected to said attenuator control unit, said variable aperture stop control unit and said workpiece stage control unit, for controlling each of said units via fourth, fifth and sixth electronic signals, respectively.

16. An apparatus according to claim 15, further including an alignment system electronically connected to said computer, for measuring an alignment state between said exposure field and one of the one or more workpiece fields, and providing to said computer a seventh electronic signal containing information corresponding to said alignment state.

17. An apparatus according to claim 16, further including:

a beam splitter arranged between said imaging optical system and said workpiece stage;

a first detector arranged along a second optical axis passing through said beam splitter and perpendicular to said first axis so as to receive a portion of radiation traveling from said light source to said workpiece stage from a first surface of said beam splitter, said first detector electronically connected to said computer and capable of transmitting an eighth electronic signal thereto in response to said received first portion of radiation; and a second detector arranged along said second optical axis and adjacent a second surface of said beam splitter opposite said first detector so as to receive a portion of radiation reflected from the workpiece, said second detector electronically connected to said computer and capable of transmitting a ninth electronic signal thereto in response to said received reflected portion of radiation.

18. A method of performing laser thermal processing of a workpiece over an exposure field, comprising the steps of:

a. aligning the workpiece to the exposure field;

b. providing one or more substantially incoherent radiation pulses having an irradiance from a laser light source having greater than 1000 spatial modes and capable of emitting radiation pulses having a temporal pulse length of between 1 nanosecond and 1 microsecond with a pulse to pulse repeatability of less than ±5%;

c. uniformizing said one or more radiation pulses such that said one or more radiation pulses vary in uniformity by less than ±5% over said exposure field; and d. exposing the workpiece with said one or more radiation pulses over said exposure field.

19. A method according to claim 18, further including the steps of:

e. monitoring said one or more radiation pulses reflected from said workpiece; and f. controlling said step d.,of exposing the workpiece based on said monitoring step e.

20. A method according to claim 19, further including the step of:

g. changing a dimension of said exposure field.

21. A method according to claim 18, wherein said step d. of uniformizing said one or more radiation pulses includes the steps of:

e. passing said one or more radiation pulses through a diffuser; and f. passing said one or more radiation pulses from said diffuser of step e. through a light tunnel having reflective surfaces, such that said one or more radiation pulses reflect from said reflective surfaces at least eight times.

22. A method according to claim 18, further including the step of:

e. attenuating said one or more radiation pulses of step b. to achieve a desired irradiance over the exposure field.

23. A method according to claim 18, wherein said laser light source has 10,000 spatial modes or greater.

24. A method according to claim 18, wherein each of said one or more radiation pulses has an irradiance between 0.1 and 1 $J/cm^2$.

25. A method according to claim 18, further including the step of:

e. automatically removing the workpiece and replacing it with another workpiece.

26. A method of performing laser thermal processing of a workpiece over an exposure field, comprising the steps of:

a. aligning the workpiece to the exposure field;

b. activating a laser light source having more than 1000 spatial modes to generate one or more radiation pulses;

c. uniformizing said one or more radiation pulses to form a uniformized beam of pulsed radiation;

d. transferring said uniformized beam of pulsed radiation to a variable aperture stop; and e. imaging said variable aperture stop onto the workpiece so as to expose the workpiece with said uniformized beam of pulsed radiation.

27. A method according to claim 26, further including the step of:

f. monitoring a portion of said uniformized beam traveling from said laser light source to the workpiece.

28. A method according to claim 27, where the illumination has a uniformity of ±5% or less.

29. A method according to claim 26, further including the step of:

f. monitoring a portion of said uniformized beam reflected from the workpiece.

30. A method according to claim 26, wherein said uniformizing step c. includes the step of:

f. passing said one or more pulses of radiation through a diffuser and through an optical integrator.

31. A method according to claim 26, wherein said one or more radiation pulses have a pulse to pulse stability of ±5% or less.

* * * * *